United States Patent [19]

Tatsuno et al.

[11] Patent Number: 5,021,647
[45] Date of Patent: Jun. 4, 1991

[54] OPTICAL FIBER SENSOR HAVING FUNCTION OF COMPENSATING FOR ALL DRIFTING COMPONENTS

[75] Inventors: Kyoichi Tatsuno, Yamato; Toshiya Umeda, Tokyo, both of Japan

[73] Assignee: Kabushiki Kaisha Toshiba, Kawasaki, Japan

[21] Appl. No.: 360,889

[22] PCT Filed: Sep. 30, 1988

[86] PCT No.: PCT/JP88/01006
§ 371 Date: May 30, 1989
§ 102(e) Date: May 30, 1989

[87] PCT Pub. No.: WO89/03046
PCT Pub. Date: Apr. 6, 1989

[30] Foreign Application Priority Data

Sep. 30, 1987 [JP] Japan .................. 62-246768
Sep. 21, 1988 [JP] Japan .................. 63-236871

[51] Int. Cl.$^5$ .................. H01J 5/16; G01R 31/00
[52] U.S. Cl. .................. 250/227.21; 250/227.23; 250/225; 250/205; 324/96
[58] Field of Search .................. 250/225, 227, 231 R, 250/205, 231 P, 227.23, 227.21, 227.17, 227.18, 231.10, 231.19; 324/96; 73/705; 356/365, 368; 350/374

[56] References Cited

U.S. PATENT DOCUMENTS

| 4,584,470 | 4/1986 | Iizuka et al. | 250/231.1 |
| 4,631,402 | 12/1986 | Nagatsuma et al. | 250/231 R |
| 4,644,153 | 2/1987 | Ida | 250/227 |
| 4,683,421 | 7/1987 | Miller et al. | 250/227 |
| 4,694,243 | 9/1987 | Miller et al. | 324/96 |
| 4,698,497 | 10/1987 | Miller et al. | 324/96 |
| 4,703,175 | 10/1987 | Salour et al. | 250/227 |
| 4,743,119 | 5/1988 | Ida | 250/227 |
| 4,814,930 | 3/1989 | Abe et al. | 250/227 |

FOREIGN PATENT DOCUMENTS 58-172556 10/1983 Japan .
59-670 5/1984 Japan .
61-118633 6/1986 Japan .

OTHER PUBLICATIONS

Optics Letters; G. Beheim and D. J. Anthan; Mar. 1987, vol. 12, No. 3, p. 220.
Optics and Laser Technology; A. H. Smith; Feb. 1980, vol. 12, No. 1, p. 25.
Journal of Lightware Technology; K. Kyuma et al., 1983, vol. LT-1, No. 1.

Primary Examiner—David C. Nelms
Assistant Examiner—Michael Messinger
Attorney, Agent, or Firm—Oblon, Spivak, McClelland, Maier & Neustadt

[57] ABSTRACT

An optical fiber sensor, which has a detector section connected in a single optical path made of an optical-fiber cable and having a light-modulating element and an optical element connected in series. The light-modulating element has its birefringence degree changed in accordance with the physical quantity to be sensed, thereby to modulate the polarization state of the physical quantity. The optical element converts the polarization state of the physical quantity into the intensity of light. The sensor further comprises two light sources, which apply two light beams having different wavelengths $\lambda_1$ and $\lambda_2$ to one end of the optical path. The intensities $P_1$ and $P_2$ of the beams of the wavelengths $\lambda_1$ and $\lambda_2$, both emitted from the other end of the optical path, are detected. The intensities $\lambda_1$ and $\lambda_2$ vary in accordance with the changes in the intensity of the light emitted from the light sources, in the loss at the optical-fiber cable and the optical connector, and in the physical quantity to be detected. To obtain data free of the changes in the intensity of the light emitted from the light sources, in the loss at the optical-fiber cable and the optical connector, one type of the sensor has means for controlling one of the light sources such that the intensities $P_1$ and $P_2$ are at the same level, and means for detecting the intensities $P_{01}$ and $P_{02}$ of the light beams emitted from the two light sources and performing the calculation of $(P_{01} - P_{02})/(P_{01} + P_{02})$.

4 Claims, 6 Drawing Sheets

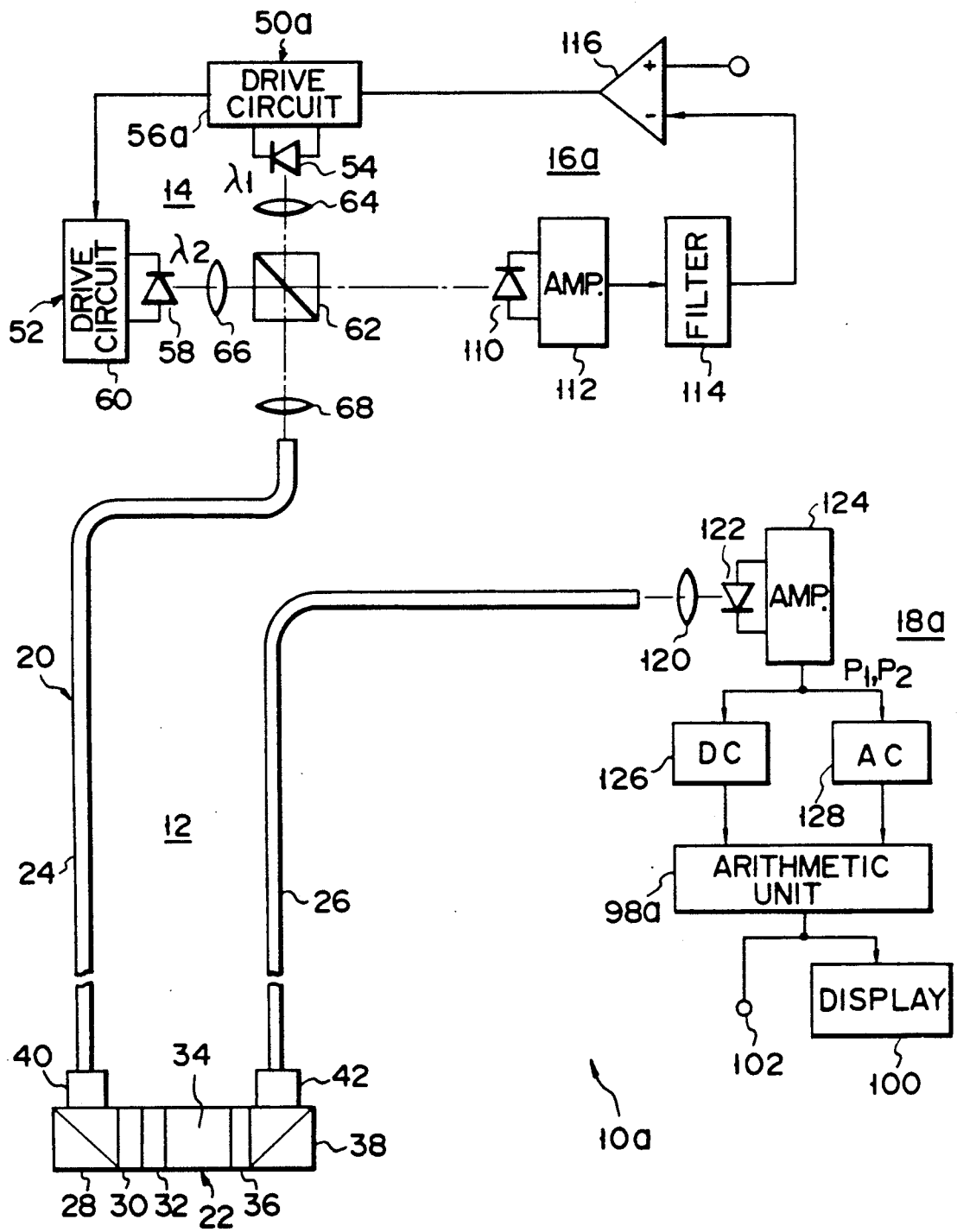
F I G. 3

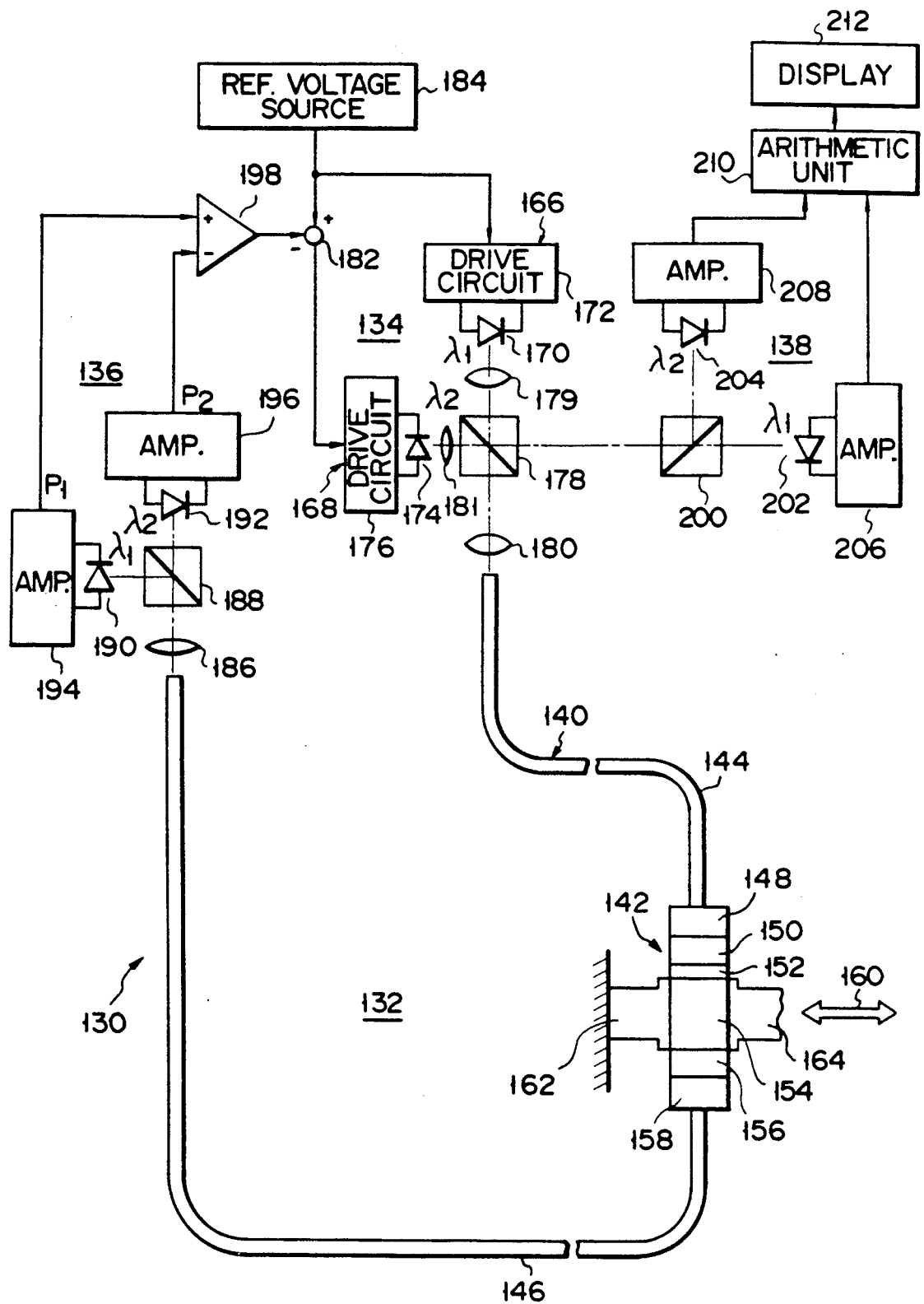
F I G. 5

OPTICAL FIBER SENSOR HAVING FUNCTION OF COMPENSATING FOR ALL DRIFTING COMPONENTS

TECHNICAL FIELD

The present invention relates to an optical fiber sensor, and more particularly to a sensor including a detector section connected in a single optical path made of an optical-fiber cable, and comprising a series of elements whose degrees of birefringence change in accordance with the physical quantities to be sensed.

BACKGROUND ART

A variety of optical fiber sensors have come into use. Among them are: a voltage sensor which is a combination of a Pockels cell and an optical-fiber cable; a current sensor which is a combination of a Faraday cell and an optical-fiber cable; and a pressure sensor which is a combination of a photoelastic cell and an optical-fiber cable. Each of these sensors has a detector section connected in a single optical path made of an optical-fiber cable. The detector section comprises a light-modulating element and an optical element connected in series. In the light-modulating element, its birefringence degree changes in accordance with the physical quantity sensed. The polarization state of the light output from the light-modulating element is modulated thereby. The optical element converts the polarization state into the intensity of light. The signals exchanged between the detector section and a device connected to the sensor are exclusively optical signals. Therefore, the optical fiber sensor is greatly insulative and explosion-proof, and can be used in various conditions. It is not only versatile, but also greatly safe.

These optical fiber sensors have yet to be used widely, however. This is because they make large detection errors. Each of these sensors requires a light source. The intensity of the light from the light source is likely to change with temperature or the like. The loss in the optical-fiber cable, and also the loss in the optical connector connective the cable vary slightly even with external factors. Such a change, if occurring, results in a detection error. The optical fiber sensor should therefore be equipped with means for sufficiently compensating for the change mentioned above.

Known as a method of compensating for the drift of a detection signal, which has resulted from the above-mentioned change, is the method disclosed in Ohnishi, ed., *Optical Fiber Sensors.* Ohm Co., 1986, pp. 131-133. In this method, the AC component of the optical signal generated by a detector section is divided by the DC component of the signal, thereby to compensate for the drift, or the light source is controlled, thereby to adjust the intensity of the output light such that the mean light intensity detected by the detector section is constant, thus compensating for the drift.

This method is effective when the physical quantity to be detected changes alternately, but cannot compensate for the drift when the physical quantity changes linearly.

In another method, two polarized components, whose planes are perpendicular to each other, are supplied via an optical-fiber cable. The difference between these polarized components is divided by the sum of the components, thereby compensating for a drift component. In another known method, two light sources emitting light beams of different wavelengths are used. The light beam emitted from the first light source is supplied to a detector section through the optical-fiber cable, while the light beam emitted from the second light source is passed through an optical-fiber cable used as a dummy. The intensity of the light, detected by the detector section, is divided by the intensity of the light passed through the dummy optical-fiber cable, thereby compensating for a drift component.

Either method described above cannot compensate for a drift component. This is because the light required for the compensation is guided through a system other than the detecting system, and it is difficult to equalize the changes in the loss at the optical-fiber cables and optical connectors of both systems.

Accordingly, the object of the present invention is to provide an optical fiber sensor, which is relatively simple in structure and can reliably compensate for the changes in the intensity of the light emitted from the light source and the changes in the loss at the optical-fiber cable and the optical connector, even if the physical quantity to be sensed varies either alternately or linearly.

DISCLOSURE OF THE INVENTION

An optical fiber sensor according to the present invention comprises: a detector section connected in a single optical path made of an optical-fiber cable and having a light-modulating element and an optical element connected in series, the light-modulating element whose birefringence degree changes in accordance with the physical quantity to be sensed, thereby to modulate the polarization state of the physical quantity, and the optical element designed for converting the polarization state of the physical quantity into the intensity of light; two light sources for emitting light beams of different wavelengths; means for maintaining the ratio between the intensities of the light beams emitted by the light sources; means for applying the light beams of different wavelengths, emitted from the light sources, to one end of the optical path; means for detecting the intensities of the two light beams emitted from the other end of said optical path; and means for converting a value, which has been obtained by dividing the difference between the intensities of the two light beams by the sum thereof, into a physical quantity.

In this optical fiber sensor, the ratio between the intensities of the light beams emitted by the light sources is maintained. The light beams having different wavelengths, emitted from the two light sources, are applied to the detector section. The detector section converts the light beams to light having intensities corresponding to the physical quantity, and emits these light beams. The intensities $P_1$ and $P_2$ of the light beams emitted from the detector section depend upon the physical quantity and also upon the losses in the optical-fiber cable and the optical connector which constitute part of the detector section. The ratio of the loss of the first beam, applied to the detector section, to the intensity thereof is substantially equal to the ratio of the loss of the second light beams, applied to the detector section, to the intensity thereof. This is because both light beams pass through the same detector section. Hence, the calculation of $(P_1-P_2)/(P_1+P_2)$ is performed, the value which corresponds to the physical quantity is obtained. The value, thus obtained, is collated with a calibration table already prepared, whereby the physical quantity is detected without error.

Another optical fiber sensor according to the present invention comprises: a detector section connected in a single optical path made of an optical-fiber cable and having a light-modulating element and an optical element connected in series, the light-modulating element whose birefringence degree changes in accordance with the physical quantity to be sensed, thereby to modulate the polarization state of the physical quantity, and the optical element designated for converting the polarization state of the physical quantity into the intensity of light; two light sources for emitting light beams of different wavelengths; means for applying the light beams of different wavelengths, emitted from the light sources, to one end of the optical path; means for detecting the intensities of the two light beams having different wavelengths, emitted from the other end of the optical path; means for controlling one of the light sources such that the intensities of the two light beams having different wavelengths and detected by said means are at the same level; and means for converting a value, which has been obtained by dividing the difference between the intensities of the two light beams by the sum thereof, into a physical quantity.

In this optical fiber sensor, one of the light sources is controlled such that the intensities of the two light beams having different wavelengths and detected by said means are at the same level. Due to this control, the difference between the intensities $P_1$ and $P_2$ of the two light beams of different wavelengths, both emitted from the detector section, is changed to the difference between the intensities $P_{01}$ and $P_{02}$ of the light beams emitted from the two light sources. In this case, the intensities $P_1$ and $P_2$ of the two light beams output from the detector section are determined by the intensities of the beams emitted from the light sources, the physical quantity, and the losses in the detector section. The ratio of the loss of the first beam, applied to the detector section, to the intensity thereof is substantially equal to the ratio of the loss of the second light beams, applied to the detector section, to the intensity thereof. This is because both light beams pass through the same detector section. Thus, the only factor detrimental to the detection is the changes in the intensities of the beams emitted from the light sources. Nonetheless, the ratio between the intensities $P_{01}$ and $P_{02}$ is determined by the intensity of the light beam, which corresponds to the physical quantity when the difference between the intensities $P_1$ and $P_2$ is converted to the difference between the intensities $P_{01}$ and $P_{02}$. Hence, when the calculation of $(P_{01} - P_{02})/(P_{01} + P_{02})$ is performed, the drift is cancelled, and the value corresponding to the physical quantity is obtained. The value, thus obtained, is collated with a calibration table already prepared, whereby the physical quantity is detected without error.

BRIEF DESCRIPTION OF THE DRAWINGS

FIG. 3 is a diagram showing the structure of an optical fiber sensor, according to another embodiment of this invention;

FIG. 5 is a diagram showing the structure of an optical fiber sensor, according to still another embodiment of the present invention.

BEST MODE OF EMBODYING THE INVENTION

The embodiments of the present invention will described, with reference to the accompanying drawings.

Figure 1:
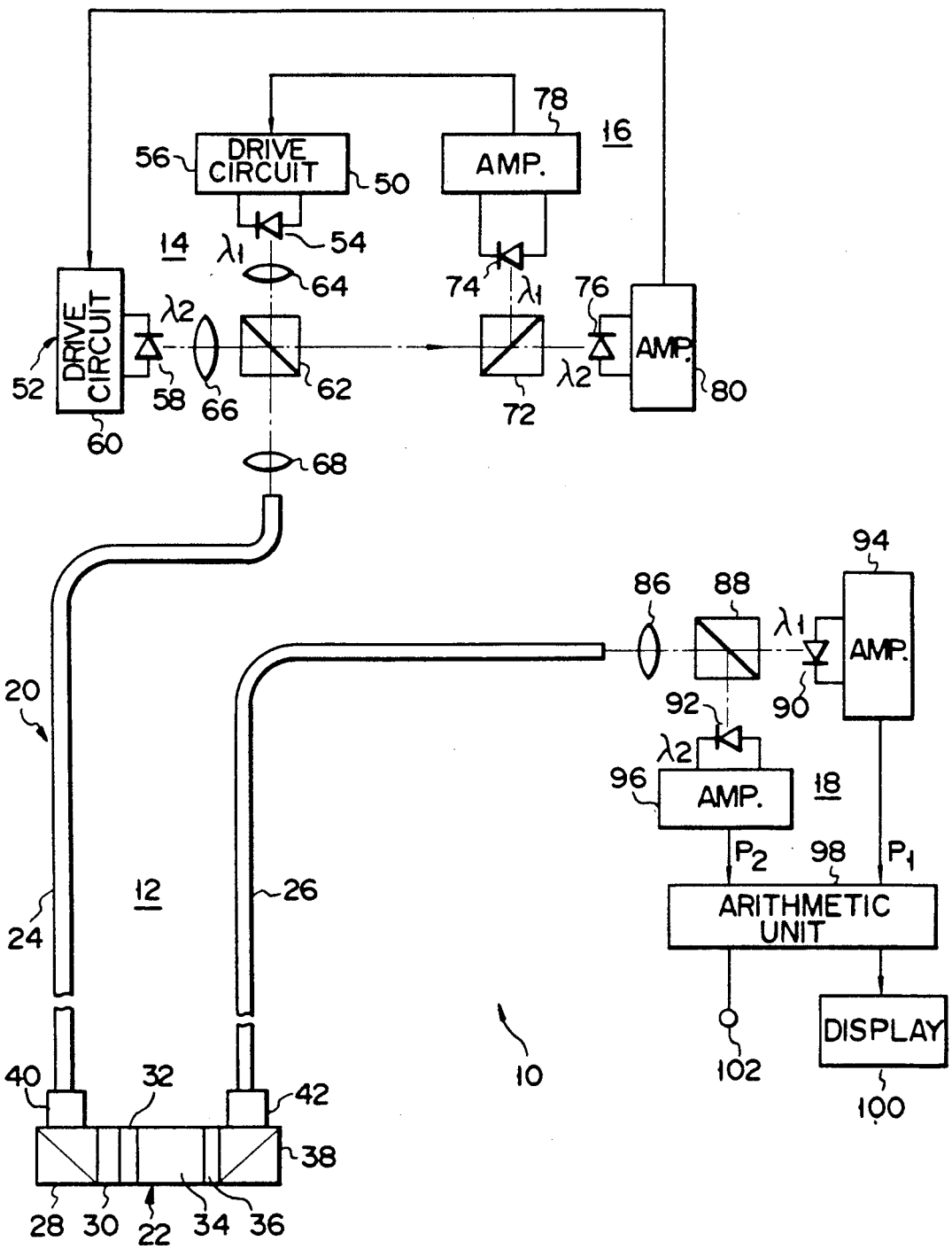
FIG. 1 is a diagram showing the structure of an optical fiber sensor, according to one embodiment of the present invention.

FIG. 1 schematically shows the structure of an electric-field sensor 10, i.e., an optical fiber sensor, according to a first embodiment of the invention.

The electric-field sensor 10 comprises four major components, i.e., a detector section 12, a light-source unit 14, a light-source control device 16, and a signal-processing device 18.

The detector section 12 comprises an optical path 20 and optical elements 22 connected in series on the optical path 20. The optical path 20 comprises an optical-fiber cable 24 and an optical-fiber cable 26. The optical elements 22 are coupled in series between the optical-fiber cables 24 and 26.

The optical elements 22 are located in the space where the electric field, which is to be detected, is generated. The optical elements 22 are: a reflector 28 having a reflection surface inclined at 45°, a polarizer 30, a phase plate 32, a Pockels cell 34, an analyzer 36, and a reflector 38 having a reflection surface inclined at 45°—arranged in this order from the left to the right (FIG. 1), in the same optical axis. The Pockels cell 34 is, in this embodiment, one made of material $Bi_4(GeO_4)_3$. The polarizer 30 is positioned with its polarizing surface inclined at 45° to the two major axes of the Pockels cell 34. The analyzer 36 is located with its polarizing surface positioned perpendicular to that of the polarizer 30. The light-incidence end of the reflector 28 is optically connected by a rod lens 40 to one end of the optical-fiber cable 24. The light-emitting end of the reflector 38 is also optically connected by a rod lens 42 to one end of the optical-fiber cable 26.

The light-source unit 14 comprises a first light source 50 and a second light source 52. The first light source 50 comprises an LED 54 for emitting light having a wavelength $\lambda_1$, and a drive circuit 56 for supplying a drive current to the LED 54. Similarly, second light source 52 comprises an LED 58 for emitting light having a wavelength $\lambda_2$ ($\lambda_1 < \lambda_2$), and a drive circuit 60 for supplying a drive current to the LED 58. The LEDs 54 and 58 ar located such that their optical axes intersect at right angles. At the intersection of the optical axes of the LEDs 54 and 58, a beam-splitter 62 is located which is designed to combine two light beams having different wavelengths into one beam, and to apply this beam along either optical axis. A lens 64 is interposed between the LED 54 and the beam-splitter 62, for converting the light emitted from the LED 54, into a parallel beam and for applying this beam to the beam splitter 62. Also, a lens 66 is interposed between the LED 58 and the beam splitter 62, for converting the light emitted from the LED 58, into a parallel beam and for applying this beam to the beam splitter 62. Further, a lens 68 is located in the optical axis of the LED 54, for applying to the other end of the optical fiber 24 the light beams output by the beam splitter 62 and having wavelengths $\lambda_1$ and $\lambda_2$.

The light-source control device 16 comprises a dichroic mirror 72, photodiodes 74 and 76, and amplifiers 78 and 80. The dichroic mirror 72 is located in the optical axis of the LED 58, for separating the light output from the beam splitter 62 into two beams having the wavelengths $\lambda_1$ and $\lambda_2$. The photodiodes 74 and 76 receives the beams having the wavelengths $\lambda_1$ and $\lambda_2$, and converts them into electric signals. The amplifiers 78 and 80 convert the current signals, or the signals output by the photodiodes 74 and 76, into voltage signals, and amplify these voltage signals. In accordance with the outputs of the amplifiers 78 and 80, the inputs of the drive circuits 56 and 60 are controlled. The drive circuits 56 and 60 includes a reference signal source each. The drive circuit 56 compares the output level of the reference signal source with that of the amplifier 78, and controls the input current of the LED 54 to reduce the difference between the compared levels to zero or a prescribed value. Similarly, the drive circuit 60 compares the output level of the reference signal source with that of the amplifier 80, and control the input current of the LED 58 to reduce the difference between the compared levels to zero or a prescribed value. In other words, the light-source device 16 carries out feedback control thereby maintaining the intensities of the light beams emitted by the LEDs 54 and 58 at the specific levels.

The signal-processing device 18 is designed to function as follows. The light emitted from the other end of the optical-fiber cable 26 is changed into a parallel beam by means of a lens 86. The beam is guided to a dichroic mirror 88 and separated into two light beams having wavelengths $\lambda_1$ and $\lambda_2$. The beam of the wave-length $\lambda_1$ is converted into an electric signal by a photodiode 90, while the beam of the wavelength $\lambda_2$ is converted into an electric signal by a photodiode 92. The output signals of the photodiodes 90 and 92, which are current signals, are converted into voltage signals and amplified by amplifiers 94 and 96. The amplified voltage signals are input to an arithmetic unit 98. The arithmetic unit 98 performs the calculation of $(P_1P_2)/(P_1+P_2)$, where $P_1$ is the output of the amplifier 94, and $P_2$ is the output of the amplifier 96. The value found by this calculation is collated with a calibration table showing various calculating values and the electric-field intensities corresponding to these values, thereby finding the corresponding electric-field intensity. The electric-field intensity, thus found, is displayed by display 100. At the same time, a signal at the level equivalent to this electric-field intensity is supplied to the output terminal 102.

The operation of the electric-field sensor 10, which has optical fibers and the structure described above, will now be explained.

First, the drive circuits 56 and 60 supply two electric currents to the LEDs 54 and 58, respectively. As a result of this, the LED 54 emits a light beam having the wavelength $\lambda_1$, and LED 58 emits a light beam having the wavelength $\lambda_2$. These beams of different wavelengths are combined by the beam splitter 62. The combined light is applied to the optical-fiber cable 24 via lens 68. It is also applied to the dichroic mirror 72. The mirror 72 separates the combined light into two beams having the wavelengths $\lambda_1$ and $\lambda_2$.

The light beams emitted from the dichroic mirror 72, which have different wavelengths, are applied to the photodiodes 74 and 76 and converted into two electric signals. These signals are input to the drive circuits 56 and 60, respectively. The drive circuit 56 compares the input signal with the reference signal, and controls the input current of the LED 54 such that the difference between the compared signals decreases to zero. The drive circuit 60 compares the input signal with the reference signal, and controls the input current of the LED 58 such that the difference between the compared signals decreases to zero. Because of this control, the intensities $P_{01}$ and $P_{02}$ of the light beams emitted from the LEDs 54 and 58 are maintained at constant values. Hence, the ratio between the intensities $P_{01}$ and $P_{02}$ remains constant.

The combined light, applied to the optical-fiber cable 24, is applied to the polarizer 30 through the rod lens 40 and the reflector 28. The polarizer 30 emits a linear polarized beam. This linear polarized beam passes through the Pockels cell 34. As the beam passes through it, the Pockels cell 34 perform birefringence on this beam. Therefore, a phase difference is made between that component of the beam which has been polarized in the direction in which the electric field is applied, and that component of the beam which has been polarized in the direction inclined at right angles to said direction. This phase difference varies with the intensity of the electric field applied. The Pockels cell 34 modulates, as it were, the polarization state of the physical quantity which is to be detected. The analyzer 36 converts the light passing through the Pockels cell 34 into a signal representing the change in the intensity of light. The intensities $I_1$ and $I_2$ of the light beams having the wavelengths $\lambda_1$ and $\lambda_2$, both output by the analyzer 36, can be given as follows:

$$I_1 = I_{01} \sin^2(\phi_1 + \delta_1)$$

$$I_2 = I_{02} \sin^2(\phi_2 + \delta_2) \qquad (1)$$

where $I_{01}$ and $I_{02}$ are the intensities of the light beams having the wavelengths $\lambda_1$ and $\lambda_2$ and emitted from the polarizer 30.

In the equations (1), $\delta_1$ and $\delta_2$ are values which are defined as follows:

$$\delta_1 = (2\pi n^3 \gamma V)/\lambda_1 = (CV)/\lambda_1$$

$$\delta_2 = (2\pi n^3 \gamma V)/\lambda_2 = (CV)/\lambda_2$$

where n is the refractive index of the Pockels cell 34, $\gamma$ is the electrooptic coefficient thereof, V is the intensity of the electric field applied thereto, and C is a constant.

Also, in the equations (1), $\phi_1$ and $\phi_2$ are the values specific to the phase plate 32. Assuming that the phase plate 32 causes the light having wavelength $\lambda_1$ a phase delay of $\phi_1$, then $\phi_2$ is given as follows.

$$\phi_2 = (\lambda_1 \phi_1)/\lambda_2$$

The light having the wavelengths $\lambda_1$ and $\lambda_2$, which has been output from the analyzer 36, are applied to the dichroic mirror 88 through the optical-fiber cable 26 and lens 86. The mirror 88 separates the light into two beams having the wavelengths $\lambda_1$ and $\lambda_2$. The photodiode 90 and the amplifier 94 convert the light beam of the wavelength $\lambda_1$ into a signal which is proportional to the intensity of the light beam. Also, the photodiode 92 and the amplifier 96 convert the light beam of the wavelength $\lambda_2$ into a signal which is proportional to the intensity of this light beam. The amplifiers 94 and 96 output signals $P_1$ and $P_2$, the magnitudes of which are given:

$$P_1 = fP_{01} \sin^2(\phi_1 + \delta_1)$$

$$P_2 = fP_{02} \sin^2(\phi_2 + \delta_2) \quad (2)$$

where $P_{01}$ is the intensity of the light having the wavelength $\lambda_1$ and emitted from the LED 54, $P_{02}$ is the intensity of the light having the wavelength $\lambda_2$ and emitted from the LED 58, and f is the loss factor of the elements forming the optical path 20. This loss factor f varies with the losses in the optical-fiber cables 24 and 26 and also with the losses in the optical connectors (not shown) used in the optical path 20. The values for f's in the equations (2) are substantially the same since both light beams of the wavelengths $\lambda_1$ and $\lambda_2$ are guided via the common path, i.e., the optical path 20.

The arithmetic unit 98 receives the signals output by the amplifiers 94 and 96, and it then performs the calculation of $(P_1-P_2)/(P_1+P_2)$ That is:

$$(P_1 - P_2)/(P_1 + P_2) \quad (3)$$
$$= \{fP_{01} \sin^2(\phi_1 + \delta_1) - fP_{02} \sin^2(\phi_2 + \delta_2)\}/$$
$$\{fP_{01} \sin^2(\phi_1 + \delta_1) + fP_{02} \sin^2(\phi_2 + \delta_2)\}$$

Thus, f is completely eliminated. Further, the intensities of the light beams emitted by the LEDs 54 and 58 are rendered constant under the control of the light-source control device 16. Assuming that the intensities of the light beams output by the LEDs 54 and 58 are controlled such that the ratio between them is 1:1, then, $P_{01} = P_{02}$, and both $P_{01}$ and $P_{02}$ are eliminated, too. Therefore, the calculation specified above results in a solution having only constants and variables which depend the intensity of the electric field.

Figure 2:
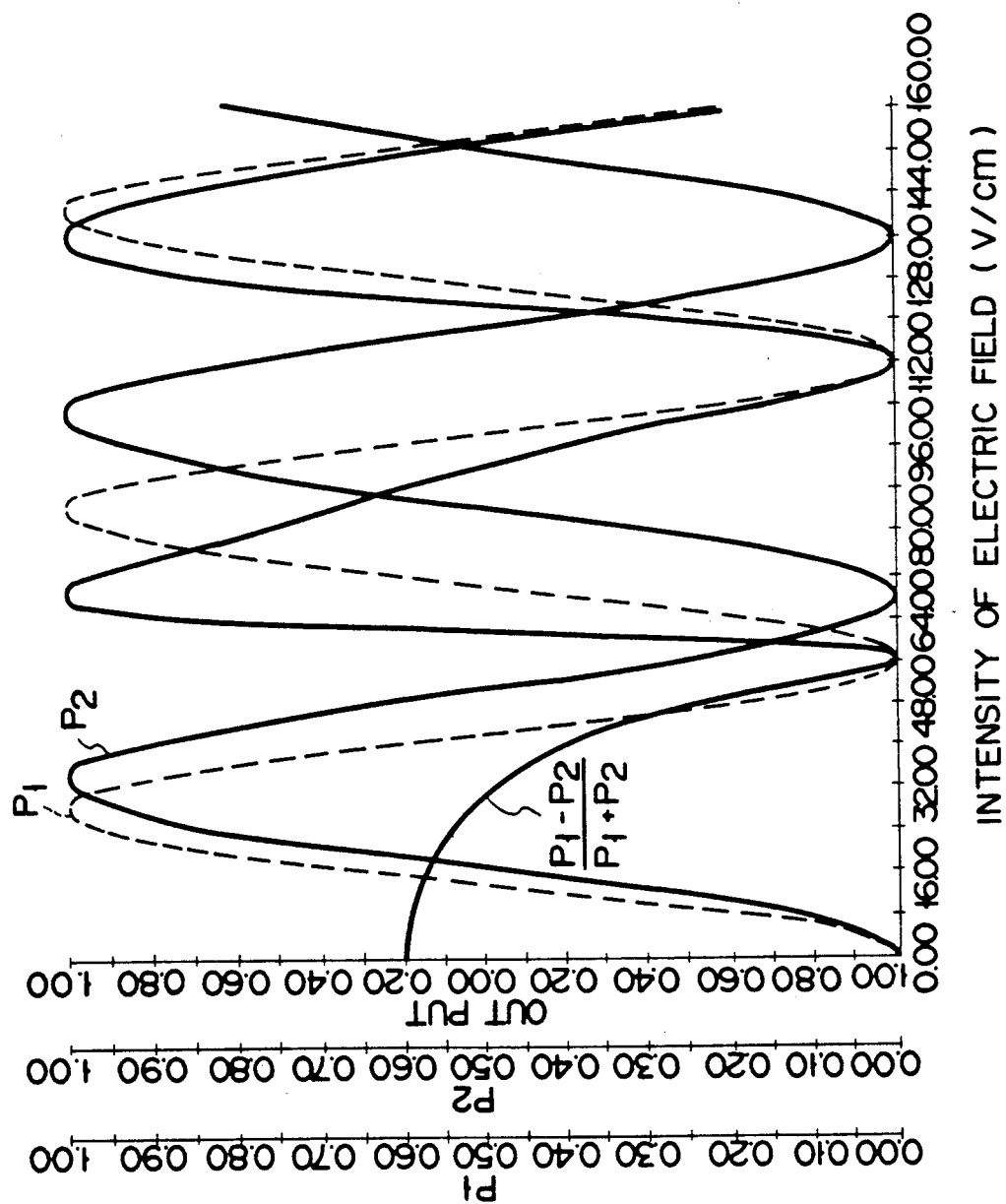
FIG. 2 is a diagram representing an example of a calibration table used in the sensor.

FIG. 2 is a diagram representing a calibration table which can apply to the case where use is made of LEDs which emit light beams having wavelengths of 730 nm ($\lambda_1$) and 865 nm ($\lambda_2$). In the figure, the intensity of the electric field applied is plotted on the horizontal axis, and $P_1$, $P_2$, and $(P_1-P_2)/(P_1+P_2)$ are plotted on the vertical axis. The arithmetic unit 98 finds the intensity of the electric field by collating the solution of the above calculation with the calibration table shown in FIG. 2. The electric-field intensity, thus found, is displayed by the display 100, and a signal at the level equivalent to the intensity of the electric field is supplied to the output terminal $1_{o2}$.

Therefore, the electric-field sensor 10 of the structure described above can detect the intensity of the electric field with accuracy, even if the loss in the optical path 20 varies.

FIG. 3 illustrates an electric-field sensor 10a having optical fibers, according to another embodiment of this invention. In this figure, the same numerals designate the same elements as those shown in FIG. 1. The same elements as those illustrated in FIG. 1 will not, therefore, be described in detail.

The sensor 10a according to this embodiment is different from the one shown in FIG. 1, in the structure of the light-source control device 16a and also in that of a signal-processing device 18a.

More specifically, the light-source control device 16a comprises a photodiode 110 opposing an LED 58, with a beam splitter 62 located therebetween, an amplifier 112 for converting the current signal output by this photodiode 110 into a voltage signal and amplifying the voltage signal, a high-pass filter 114 for allowing the passage of only the AC component of the output from the amplifier 112, and a differential amplifier 116 for supplying the output of the filter 114, as a control signal, to the drive circuit 56a of a first light source 50a. The drive circuit 56a has a built-in control system for controlling the drive current of the LED 54, i.e., the intensity of the light emitted from the LED 54, thereby to reduce the control signal zero.

Figure 4A:
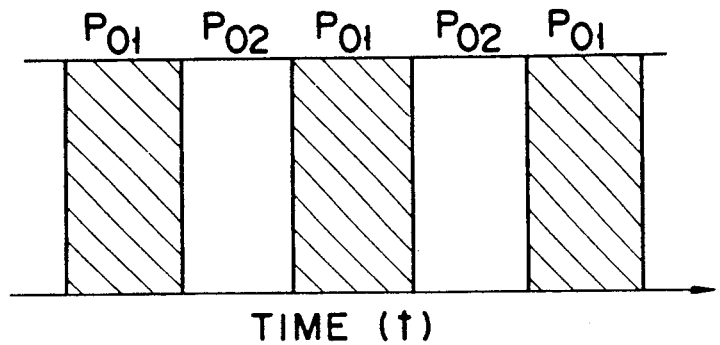
FIGS. 4a and 4b show graphs representing the relationship between the intensities of the light beams from the light sources used in the sensor, on the one hand, and the intensities of the light beams which have been modulated.

The drive circuits 56a and 60 operate in synchronism with each other and supply the drive current alternately to the LEDs 54 and 58. The LED 54 applies light of wavelength $\lambda_1$ intermittently, and the LED 58 applies light of wavelength $\lambda_2$ intermittently. The light beams having wavelengths $\lambda_1$ and $\lambda_2$ pass through the beam splitter 62. They are input, in part, to the optical fiber cable 24 through the lens 68, and also supplied, in part, to the photodiode 110. The light supplied to the photodiode 110 is converted into a current signal, which is converted into an voltage signal by means of the amplifier 112. The high-pass filter 114 extracts the AC component from the voltage signal. The AC component, or the extracted signal is supplied, as a control signal, to the drive circuit 56a. The drive circuit 56a controls the intensity of the light emitted by the LED 54, such that the control signal is reduced to zero. For this reason, the intensities $P_{01}$ and $P_{02}$ of the light beams emitted from the LEDs 54 and 58 are maintained at the same level at all times, as is illustrated in FIG. 4(A). Hence, also in this embodiment, the intensities of the light beams having the wavelengths $\lambda_1$ and $\lambda_2$, which have been input to the optical-fiber cable 24 are maintained at constant values.

Figure 4B:
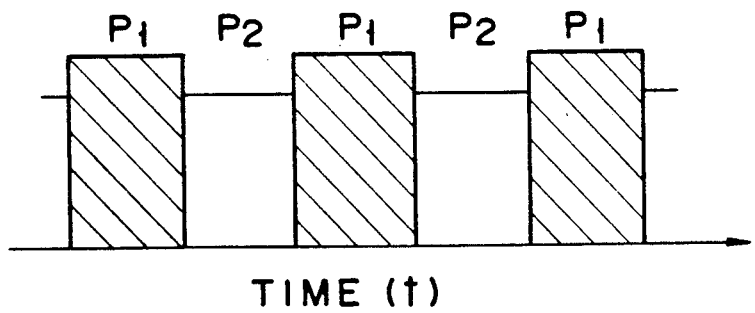

The signal-processing device 18a comprises a photodiode 122 for receiving the light from the optical-fiber cable 26 via the lens 120 and converting this light into a current signal, an amplifier 124 for converting the current signal output by the photodiode 122, into a voltage signal and amplifying the voltage signal, a low-pass filter 126 for allowing the passage of only the DC component of the output from the amplifier 124, a high-pass filter 128 for allowing the passage of only the AC component of the output from the amplifier 124, an arithmetic unit 98a for receiving the outputs of both filters 126 and 128, and a display 100. beams are polarized and modulated by the Pockels cell 34 in accordance with the intensity of the electric field. Then, they are converted to the light beams representing the intensity. The light beams are applied from the optical-fiber cable 26. They are converted into current signals by the photodiode 122, and the current signals are converted into voltage signals by the amplifier 124. As a result, the amplifier 124 alternately outputs two signals representing $P_1$ and $P_2$ given by the equations (2), as is shown in FIG. 4(B). These output signals are input to the low-pass filter 126 and the high-path filter 128, respectively. Hence, the low-pass filter 126 outputs a signal at the level of $P_A=(P_1+P_2)/2$, and the high-pass filter 128 outputs a signal at the level of $P_B=(P_1-P_2)$. The two signals representing to these values $P_A$ and $P_B$, respectively, are input to the arithmetic unit 98a. The arithmetic unit 98a performs the calculation of $P_B/P_A$. The calculation is equivalent to that one performed by the arithmetic unit 98 of the sensor shown in FIG. 1. Namely, the loss factor f of the optical path 20, and the intensities $P_{01}$ and $P_{02}$ of the light beams emitted from the LED 54 and 58 are eliminated. It follows that the results of the calculation performed by the unit 98a contain only constants and variables depending upon the intensity of the electric field. The arithmetic unit 98a collates the result with a calibration table already prepared, thereby determining the intensity of the electric field, causes the display 100 to display the electric-field intensity, and outputs a voltage corresponding to the electric-field intensity to the output terminal 102.

As a result, the embodiment shown in FIG. 3 can also detect the intensity of an electric field with accuracy, despite of the variation, if any, of the loss in the optical path 20.

FIG. 5 shows still another embodiment of the optical fiber sensor, i.e., a pressure sensor 130 according to the present invention.

The pressure sensor 130 also has four major components: a detector section 132, a light-source unit 134, a light-source control device 136, and a signal-processing device 138.

The detector section 132 comprises an optical path 140 and optical elements 142 connected in series on the optical path 140. The optical path 140 comprises an optical-fiber cable 144 and an optical-fiber cable 146.

The optical elements 142 are coupled in series between the optical-fiber cables 144 and 146. The optical elements 142 are located at a position where a pressure, which is to be detected, is applied.

The optical elements 142 are: a rod lens 148, a polarizer 150, a phase plate 152, a photoelastic cell 154, an analyzer 156, and a rod lens 158—arranged in this order from the top to the bottom (FIG. 5), in the same optical axis. In this embodiment, the photoelastic cell 154 is a prism which is made of silica glass. Two pressure-transmitting members 162 and 164 are formed on the two opposing sides of the photoelastic cell 154. The pressure, which is to be sensed, is applied on these members 162 and 164 in the directions of arrows 160. The polarizer 150 is positioned with its polarizing surface inclined at 45° to the direction in which the pressure is applied. The analyzer 156 is located, with its polarizing surface positioned perpendicular to that of the polarizer 150. The light-incidence end of the rod lens 148 is optically connected to one end of the optical-fiber cable 144. The light-emitting end of the rod lens 158 is also optically connected to one end of the optical-fiber cable 146.

The light-source unit 134 comprises a first light source 166 and a second light source 168. The first light source 166 comprises an LED 170 for emitting light having a wavelength $\lambda_1$, and a drive circuit 172 for supplying a drive current to the LED 170. The second light source 169 comprises an LED 174 for emitting light having a wavelength $\lambda_2$ ($\lambda_1 < \lambda_2$), and a drive circuit 176 for supplying a drive current to the LED 174. The LEDs 170 and 174 are located such that their optical axes intersect at right angles. At the intersection of the optical axes of the LEDs 170 and 174, a beam-splitter 178 is located which is designed to combine two light beams having different wavelengths into one beam and to apply this beam along either optical axis. A lens 179 is interposed between the LED 170 and the beam splitter 178. Also, a lens 181 is interposed between the LED 174 and the beam splitter 178. The other end of the optical-fiber cable 144 is located in the optical axis of the LED 170 and opposes the LED 170, with the beam splitter 178 interposed between them. A lens 180 is located between the beam splitter 178 and the other end of the optical-fiber cable 144. The input of the drive circuit 172 is directly connected to the output of a reference-voltage source 184. The input of the drive circuit 176 is connected by an adder 182 to the output of the reference-voltage source 184.

The light-source control device 136 comprises a lens 186 for converting the light output from the other end of the optical-fiber cable 146, into a parallel light beam, a dichroic mirror 188 for separating the parallel light beam into two beams having wavelengths $\lambda_1$ and $\lambda_2$, photodiodes 190 and 192 for converting the beams of the wavelengths $\lambda_1$ and $\lambda_2$ into electric signals, amplifiers 194 and 196 for converting the output signals of the photodiodes 190 and 192, which are current signals, into voltage signals, and amplifying these voltage signals, and a differential amplifier 198 for supplying a signal, which represents the difference between the outputs of the amplifiers 194 and 196, to the adder 182.

The signal-processing device 138 comprises a dichroic mirror 200 located in the optical axis of the LED 174 and opposing the LED 174, with the beam splitter 178 interposed between them, for separating the light beam output by the beam splitter 178 into two light beams having wavelengths $\lambda_1$ and $\lambda_2$, photodiodes 202 and 204 for converting the light beams of the wavelengths $\lambda_1$ and $\lambda_2$ into two current signals, amplifiers 206 and 208 for converting these current signals into voltage signals and amplifying the voltage signals, an arithmetic unit 210 for processing the output signals of the amplifiers 206 and 208, and a display 212. The arithmetic unit 210 performs the calculation of $(P_{01} - P_{02}')/(P_{01} + P_{02}')$, where $P_{01}$ is the output of the amplifier 206, and $P_{02}'$ is the output of the amplifier 208. The value found by this calculation is collated with a calibration table showing various calculated values and various pressures equivalent to these values, thereby finding the pressure equivalent to the calculated value. The value of this pressure, thus found, is displayed by display 212.

The operation of the pressure sensor 130, which has optical fibers and the structure described above, will be explained.

First, the reference-voltage source 184 is turned on. Then the drive circuits 172 and 176 supply two electric currents to the LEDs 170 and 174, respectively. As a result of this, the LED 170 emits a light beam having the wavelength $\lambda_1$, and LED 174 emits a light beam having the wavelength $\lambda_2$. These beams of different wavelengths are combined by the beam splitter 178. The combined light is applied to the optical-fiber cable 144 via lens 180. It is also applied to the dichroic mirror 200. The mirror 200 separates the combined light into two beams having the wavelengths $\lambda_1$ and $\lambda_2$.

The combined light applied to the optical-fiber cable 144 is input to the polarizer 150 via the rod lens 148 and converted into a linear polarized light. This linear polarized light passes through the phase plate 152 and then through the photoelastic cell 154. As this light passes through it, the photoelastic cell 154 performs birefringence on this light. Therefore, a phase difference is made between that component of the light which has been polarized in the direction in which the pressure is applied, and that component of the beam which has been polarized in the direction inclined at right angles to said direction. This phase difference varies with the pressure applied. The photoelastic cell 154 modulates the polarization state of the pressure which is to be detected. The analyzer 156 converts the light passing through the photoelastic cell 154 into a signal representing the change in the pressure. The intensities $I_1$ and $I_2$ of the light beams having the wavelengths $\lambda_1$ and $\lambda_2$, which have been output by the analyzer 156, can be given as follows:

$$I_1 = I_{01}(1+\cos\delta_1)$$

$$I_2 = I_{02}(1+\cos\delta_2) \qquad (4)$$

where $I_{01}$ and $I_{02}$ are the intensities of the light beams having the wavelengths $\lambda_1$ and $\lambda_2$ and emitted from the polarizer 150.

In the equations (4), $\delta_1$ and $\delta_2$ are values which are defined as follows:

$$\delta_1 = 2\pi(nx-ny)l/\lambda_1 + \delta_0$$

$$\delta_2 = 2\pi(nx-ny)l/\lambda_2 + \delta_0\lambda_1/\lambda_2$$

where n is the refractive index which the photoelastic cell 154 exhibits for the component of light polarized in the direction of applying the pressure, ny is the refractive index which the cell 154 exhibits for the component of light polarized in the direction inclined at right angles to the direction of applying the pressure, $\delta_1$ and $\delta_2$ are the phase differences between these polarized components of the light, $\delta_0$ is the phase difference between the polarized components, which is given by the phase plate 152, l is the length of the photoelastic effect element 154, as measured along the direction in which light passes via the element 154, and $\pi$ is the ratio of the circumference of a circle to the diameter thereof.

The light having the wavelengths $\lambda_1$ and $\lambda_2$, which has been output from the analyzer 156, are applied to the dichroic mirror 188 through the rod lens 158, the optical-fiber cable 146, and lens 186. The mirror 188 separates the light into two beams having the wavelengths $\lambda_1$ and $\lambda_2$. The photodiode 190 and the amplifier 194 convert the light beam of the wavelength $\lambda_1$ into a signal which is proportional to the intensity of the light beam. Also, the photodiode 192 and the amplifier 196 convert the light beam of the wavelength $\lambda_2$ into a signal which is proportional to the intensity of this light beam. The amplifiers 194 and 196 output signals $P_1$ and $P_2$, the magnitudes of which are given:

$$P_1 = fP_{01}(1+\cos\delta_1)$$

$$P_2 = fP_{02}(1+\cos\delta_2) \qquad (5)$$

where $P_{01}$ is the intensity of the light having the wavelength $\lambda_1$ and emitted from the LED 170, $P_{02}$ is the intensity of the light having the wavelength $\lambda_2$ and emitted from the LED 174, and f is the loss factor of the elements forming the optical path 140. This loss factor f varies with the losses in the optical-fiber cables 144 and 146 and also with the losses in the optical connectors (not shown) used in the optical path 140. Nonetheless, the values for f's in the equations (5) are substantially the same since both light beams of the wavelengths $\lambda_1$ and $\lambda_2$ are guided via the common path, i.e., the optical path 140.

The signal output from the differential amplifier 198, which represents the difference between $P_1$ and $P_2$, is input to the adder 182. As can be understood from the path in which this signal is supplied, the LED 174 is controlled such that the intensities of light, $P_1$ and $P_2$, assume the same value at all times. Due to this control, the actual intensity of the light emitted by the LED 174 changes by a factor which is determined by the difference between the intensities $P_1$ and $P_2$. $P_1$ and $P_2$ are given as follows:

$$P_1 = P_2 = fP_{01}(1+\cos\delta_1)$$

$$P_2 = fP_{02}'(1+\cos\delta_2) \qquad (6)$$

where $P_{02}'$ is the intensity of light represented by the output of the amplifier 208, and $P_{01}$ is the intensity of light represented by the output of the amplifier 206. The equations (6) can be rewritten to:

$$P_{01} = P_2/f(1+\cos\delta_1)$$

$$P_{02}' = P_2/f(1+\cos\delta_2) \qquad (7)$$

As can be understood from the equations (7), the ratio between $P_{01}$ and $P_{02}'$ depends upon only the values shown in the parentheses, i.e., the pressure applied on the photoelastic element 154.

The combined light output by the beam splitter 178 is applied to the dichroic mirror 200. The mirror 200 separates the light into two beams having the wavelengths $\lambda_1$ and $\lambda_2$. These light beams are converted into current signals by the photodiodes 202 and 204. The current signals are converted into voltage signals by the amplifiers 206 and 208. The arithmetic unit 210 performs the calculation of $(P_{01}-P_{02}')/(P_{01}+P_{02}')$, where $P_{01}$ is the output of the amplifier 206, and $P_{02}'$ is the output of the amplifier 208. When this calculation is carried out, f, $P_{01}$, and $P_{02}'$ are eliminated completely. Hence, the solution of the following equation, which contains only the variables depending upon the pressure applied, can be obtained:

$$F = \{(1+\cos\delta_2)-(1+\cos\delta_1)\}/\{(1+\cos\delta_2)+(1+\cos\delta_1)\} \qquad (8)$$

The arithmetic unit 210 collates the value thus obtained, with such a calibration table as is shown in FIG. 2, thereby finding the pressure. This pressure is displayed by the display 212.

Therefore, the pressure sensor 130 of the structure described above can detect a pressure with accuracy, even if the losses in the optical path 140 change. In this sensor, the changes in the intensity of light, which has been detected the detector section 132, is feed back to control the LED drive circuits, whereby the changes in the intensity light is monitored to obtain the physical quantity to be detected. The circuit for calculating the physical quantity can thus be simple in structure, and can compensate the drift with high accuracy.

Figure 6:
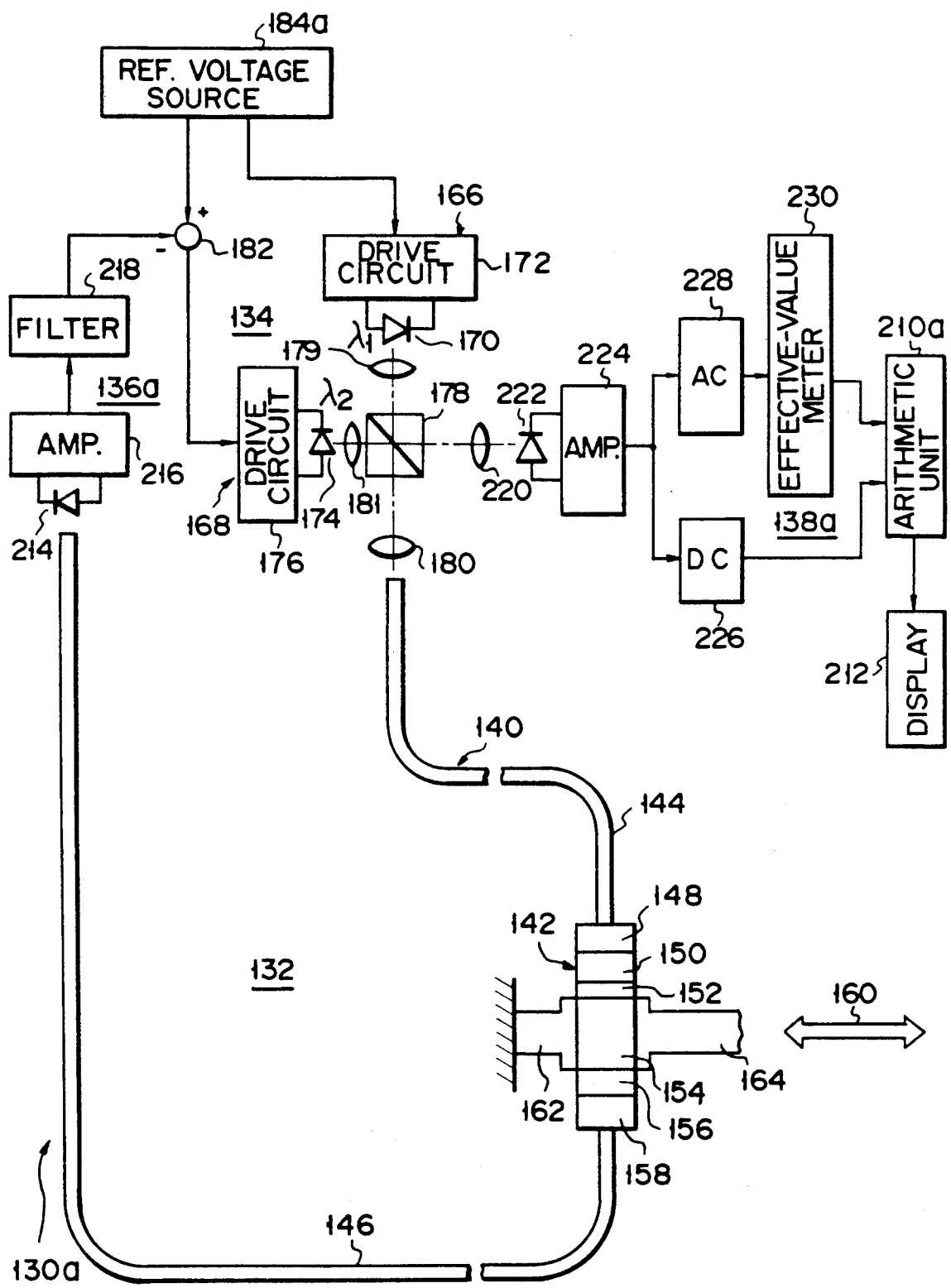
FIG. 6 is a diagram showing the structure of an optical fiber sensor, according to a further embodiment of the present invention.

FIG. 6 illustrates a pressure sensor 130a having optical fibers, according to another embodiment of this invention. In this figure, the same numerals designate the same elements as those shown in FIG. 5. The same elements as those illustrated in FIG. 5 will not, therefore, be described in detail.

The pressure sensor 130a according to this embodiment is different from the one shown in FIG. 5, in the structure of the light-source control device 136a and that of a signal-processing device 138a.

More specifically, the light-source control device 136a comprises a photodiode 214 for converting the light output from the optical-fiber cable 146, into a current signal, an amplifier 216 for converting the current signal output by this photodiode 214 into a voltage signal and amplifying the voltage signal, and a high-pass filter 218 for allowing the passage of only the AC component of the output from the amplifier 216 and supplying this AC component, as an output signal, to the adder 182. The reference voltage is applied from the reference-voltage source 184a, alternately to the drive circuits 172 and 176, directly to the former, and via the adder 182 to the latter. Since the reference voltage is applied alternately to the drive circuits 172 and 176, the LEDs 170 and 174 alternately emit the light beams having the wavelengths $\lambda_1$ and $\lambda_2$. The beams of the wavelengths $\lambda_1$ and $\lambda_2$ pass through the beam splitter 178. They are applied to the optical-fiber cable 144 via lens 180. They also pass through the optical elements 142 and the optical-fiber cable 146, and are converted into a current signal by the photodiode 214. The current signal is converted into a voltage signal by means of the amplifier 216. Therefore, two signals corresponding to signals $P_1$ and $P_2$ are alternately output. The high-pass filter 218 supplies the signal representing the difference between these two signals, to the adder 182. The LED 174 can thus be controlled to emit light of such an intensity that the intensities $P_1$ and $P_2$ are equal at all times.

The light passing through the beam splitter 178 is applied to the signal-processing device 138a. The signal-processing device 138a comprises a photodiode 222 for receiving the light from the beam splitter 178 through a lens 220, an amplifier 224 for converting the current signal produced by the photodiode 222, into a voltage signal and amplifying this voltage signal, a low-pass filter 226 for allowing the passage of only the DC component of the output signal of the amplifier 224, and a high-pass filter 228 for allowing the passage of only AC component of the output signal of the amplifier 224, an effective-value meter 230 for converting the signal passing through the filter 228, into an effective value, an arithmetic unit 210a for processing the output signals of the low-pass filter 226 and the effective-value meter 230, and a display 212.

As has been described, the LED 174 is controlled to emit light having such an intensity that $P_1 = P_2$. Hence, the ratio between the intensities of the light beams output by the LEDs 170 and 174 remains unchanged as in the pressure sensor shown in FIG. 5. The light beams output by these LEDs 170 and 174 are converted into current signals. The current signals are converted into voltage signals by the amplifier 224. Therefore, the amplifier 224 alternately outputs two signals corresponding to values $P_{01}$ and $P_{02}'$ given by the equations (7). The signals are input to the low-pass filter 226 and the high-pass filter 228, respectively. The signal output by the high-pass filter 228 is input to the effective-value meter 230. The low-pass filter 226 outputs a signal at a level of $P_A = (P_{01} + P_{02}')/2$, whereas the effective-value meter 230 outputs a signal at a level of $P_B = (P_{01} - P_{02}')/\sqrt{2}$. The signals at these levels $P_A$ and $P_B$ are input to the arithmetic unit 210a. The arithmetic unit 210a performs the calculation of $P_B/P_A$. The calculation is equivalent to that one performed by the arithmetic unit 210 of the sensor shown in FIG. 5. Namely, the loss factor f of the optical path 140, and the intensities $P_{01}$ and $P_{02}'$ of the light beams emitted from the LEDs 170 and 174 are eliminated. It follows that the results of the calculation performed by the unit 210a has only constants and variables depending upon the pressure. The arithmetic unit 210a collates the result with a calibration table already prepared, thereby determining the result, and causing the display 21 to display the result.

As a result, like the embodiment shown in FIG. 5, the embodiment shown in FIG. 6 can detect the pressure with accuracy, despite of the variation, if any, of the loss in the optical path 140.

The present invention is not limited to the embodiments described above. For instance, the detector section incorporated in the embodiments shown in FIGS. 1 and 3 can be used in the embodiments shown in FIGS. 5 and 6. Conversely, the detector section incorporated in the embodiments shown in FIGS. 5 and 6 can be used in the embodiments shown in FIGS. 1 and 3. Moreover, the present invention can apply to a temperature sensor which includes a photoelastic effect element. In short, the present invention can apply to any sensor having optical fibers, which has a detector section connected on a single optical path made of an optical-fiber cable and having a light-modulating element and an optical element connected in series, the light-modulating element having its birefringence degree changed in accordance with a physical quantity to be detected, thereby to modulate the polarization state of the physical quantity, and the optical element designed for converting the polarization state of the physical quantity into the intensity of light.

INDUSTRIAL APPLICABILITY

As has been described, the optical fiber sensor according to the present invention can be reliably compensated for the changes in the intensity of the light emitted from the light source and the changes in the loss at the optical-fiber cable and the optical connector, and can therefore meet the demand that a physical quantity, such as a voltage, a current, a pressure, or a pressure, can be detected with accuracy.

We claim:

1. An optical fiber sensor comprising:
   two light sources for emitting light beams of different wavelengths;
   means for maintaining a predetermined ratio between the intensities of the light beams emitted by the light sources;
   a single optical path comprising an optical-fiber cable;
   means for applying the light beams of different wavelengths emitted from the light sources, to one end of said single optical path;
   a detector section provided in the single optical path, and having a light-modulating element and an optical element connected in series, the light-modulating element having its birefringence degree changed in accordance with a physical quantity to be sensed, thereby to modulate polarization states of the light beams passing through the light-modulation element and output the modulated light beams, and the optical element converting the modulated light beams into light beams having intensities corresponding to the polarization states, and outputting the converted light beams from the other end of said single optical path;
   means for detecting the intensities of the two light beams emitted from the other end of said single optical path and outputting detected signals;
   means for obtaining a difference signal between the detected signals;
   means for obtaining a sum signal of the detected signals;

means for dividing the difference signal by the sum signal to obtain a desired signal corresponding to the physical quantity.

2. The sensor according to claim 1, further comprising:
means for causing said two light sources alternately to emit light.

3. An optical fiber sensor comprising:
two light sources for emitting light beams of different wavelengths;
a single optical path made of an optical-fiber cable;
means for applying the light beams of different wavelengths emitted from the light sources, to one end of said single optical path;
a detector section provided in the single optical path, and having a light-modulating element and an optical element connected in series, the light-modulating element having its birefringence degree changed in accordance with a physical quantity to be sensed, thereby to modulate polarization states of the light beam passing through the light-modulation element and output the modulated light beams, and the optical element converting the modulated light beams into light beams having intensities corresponding to the polarization states and outputting the converted light beams from the outer end of said single optical path;
first detection means for detecting the intensities of the two light beams emitted from the other end of said single optical path and outputting first detected signals;
means for controlling one of the light sources such that the first detected signals are at the same level;
second detecting means for detecting the intensities of the two light beams emitted from the light sources and outputting second detected signals;
means for obtaining a difference signal between the second detected signals;
means for obtaining a sum signal of the second detected signals;
means for dividing the difference signal by the sum signal to obtain a desired signal corresponding to the physical quantity.

4. The sensor according to claim 3, further comprising:
means for causing said two light sources alternately to emit light.

* * * * *